(12) United States Patent
Hayakawa

(10) Patent No.: US 7,057,445 B2
(45) Date of Patent: Jun. 6, 2006

(54) BIAS VOLTAGE GENERATING CIRCUIT AND DIFFERENTIAL AMPLIFIER

(75) Inventor: Yasushi Hayakawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/690,536

(22) Filed: Oct. 23, 2003

(65) Prior Publication Data

US 2005/0017795 A1    Jan. 27, 2005

(30) Foreign Application Priority Data

Mar. 6, 2003    (JP) .............................. 2003-059675

(51) Int. Cl.
*G05F 1/10*    (2006.01)
(52) U.S. Cl. .................... 327/541; 327/543; 323/315
(58) Field of Classification Search ................ 327/538, 327/540, 541, 543; 323/315
See application file for complete search history.

(56) References Cited

U.S. PATENT DOCUMENTS

| | | | |
|---|---|---|---|
| 4,442,398 A * | 4/1984 | Bertails et al. ............. | 323/315 |
| 4,450,367 A * | 5/1984 | Whatley ...................... | 323/315 |
| 4,480,231 A | 10/1984 | Takehara ..................... | 330/261 |
| 4,724,344 A * | 2/1988 | Watanabe ...................... | 327/53 |
| 5,530,340 A | 6/1996 | Hayakawa et al. ......... | 330/261 |
| 5,568,089 A | 10/1996 | Maru | |
| 5,767,699 A * | 6/1998 | Bosnyak et al. ............... | 326/86 |
| 5,900,773 A * | 5/1999 | Susak .......................... | 327/539 |
| 6,021,140 A * | 2/2000 | Clark et al. ..................... | 372/18 |
| 6,104,216 A * | 8/2000 | Satoh ........................... | 327/78 |
| 6,356,141 B1 * | 3/2002 | Yamauchi ..................... | 327/543 |
| 6,377,085 B1 * | 4/2002 | Giuroiu ......................... | 327/66 |
| 6,448,821 B1 * | 9/2002 | Sakurai ......................... | 327/66 |
| 6,518,833 B1 * | 2/2003 | Narendra et al. ............. | 327/541 |
| 6,771,117 B1 * | 8/2004 | Nakai ........................... | 327/541 |
| 2002/0093375 A1 * | 7/2002 | Grossnickle et al. ........ | 327/543 |
| 2002/0163385 A1 | 11/2002 | Ikeda | |

FOREIGN PATENT DOCUMENTS

| | | |
|---|---|---|
| JP | 7-7340 | 1/1995 |
| JP | 2002-124835 | 4/2002 |

* cited by examiner

*Primary Examiner*—Terry D. Cunningham
(74) *Attorney, Agent, or Firm*—Oblon, Spivak, McClelland, Maier & Neustadt, P.C.

(57) ABSTRACT

A bias voltage generating circuit and a differential amplifier which can ensure a constant current through a constant current circuit in a differential amplifier circuit even in case that a common mode voltage of the reference voltage signal to the differential amplifier circuit changes are attained. A constant current is generated employing a current source (Isw) and a current mirror circuit composed of a transistor (M1 and M2). The constant current is supplied to a source of a transistor (M3). A drain and a gate of a transistor (M4) are connected with a drain of the transistor (M3). A reference voltage signal (Vref) to a differential amplifier circuit is inputted to a gate of the transistor (M3), and a drain potential of the transistor (M4) is made to function as a bias voltage (biasn) to a constant current circuit in the differential amplifier circuit. Even if an absolute value of the reference voltage signal (Vref) changes, the bias voltage (biasn) has a feedback action ensuring the constant current through a constant current circuit.

4 Claims, 4 Drawing Sheets

BIAS VOLTAGE GENERATING CIRCUIT AND DIFFERENTIAL AMPLIFIER

BACKGROUND OF THE INVENTION

1. Field of the Invention

The present invention relates to a differential amplifier and a bias voltage generating circuit generating a bias voltage in the differential amplifier.

2. Description of the Background Art

For example, in a Japanese Patent Application Laid-Open No. 2002-124835 (2002), a composition of a general differential amplifier (in other words, an operational amplifier) including a differential amplifier circuit and a bias voltage generating circuit is described.

The differential amplifier circuit in the differential amplifier is generally composed of a current mirror circuit, two transistors connected respectively with two connect terminals of the current mirror circuit letting a reference current and a mirror current of a similar value to that of the reference current flow respectively and a constant current circuit connected with those two transistors in common (composed of one transistor generally). Moreover, the bias voltage generating circuit in the differential amplifier generates a bias voltage supplied to the constant current circuit in the differential amplifier circuit.

An input voltage signal and a reference voltage signal are inputted to the two transistors in the differential amplifier circuit, respectively. The differential amplifier detects a differential voltage between these signals, and amplifies and outputs this.

Besides, as for the other information disclosure statement corresponding to the invention of this application, a Japanese Patent Application Laid-Open No. 7-7340 (1995) is mentioned.

With regard to the conventional differential amplifier circuit and the bias voltage generating circuit as described above, there is a case that inconvenience occurs when a common mode voltage between the input voltage signal and the reference voltage signal decreases.

In other words, there is a case that a potential of common connect terminals of the two transistors decreases when absolute values of the respective voltages of the input voltage signal and the reference voltage signal decrease even if there is no change in a potential difference (the differential voltage) between the input voltage signal and the reference voltage signal and thus a value of a constant current flowing through the constant current circuit in the differential amplifier circuit decreases. When the constant current does not flow through the constant current circuit, it is impossible to detect the differential voltage correctly.

SUMMARY OF THE INVENTION

It is an object of the present invention to provide a bias voltage generating circuit and a differential amplifier which can ensure a constant current through a constant current circuit in a differential amplifier circuit even in case that a common mode voltage of the reference voltage signal to the differential amplifier circuit changes.

According to a first aspect of the present invention, the bias voltage generating circuit has a first constant current generating part which generates a constant current, a first transistor of a first conductivity type and a second transistor of a second conductivity type different from the first conductivity type. The first transistor includes a first current electrode to which a first potential is supplied through the first constant current generating part, a second current electrode and a control electrode. The second transistor includes a first current electrode to which a second potential different from the first potential is supplied, a second current electrode connected with the second current electrode of the first transistor and a control electrode connected with the second current electrode of the first transistor. The constant current flows between the first and the second current electrodes of the first transistor and between the first and the second current electrodes of the second transistor. A voltage signal is inputted to the control electrode of the first transistor. A potential at the second current electrode of the second transistor functions as a first bias voltage.

The constant current generated in the first constant current generating part flows between the first and the second current electrodes of the first transistor and between the first and the second current electrodes of the second transistor. Moreover, the voltage signal is inputted to the control electrode of the first transistor, and the potential at the second current electrode of the second transistor functions as the first bias voltage. In this bias voltage generating circuit, a reference voltage signal to a differential amplifier circuit in a differential amplifier is applied as the voltage signal inputted to the control electrode of the first transistor, and the first bias voltage is made to function as the bias voltage to a constant current circuit included in the differential amplifier circuit. Then, when an absolute value of the reference voltage signal changes, a voltage drop amount in the first transistor changes, and the first bias voltage can be made to change. In other words, this bias voltage generating circuit has a feedback action ensuring a constant current value in the constant current circuit included in the differential amplifier circuit. Accordingly, the bias voltage generating circuit which can ensure a constant current in the constant current circuit in the differential amplifier circuit is attainable, even in case that a common mode voltage of the reference voltage signal to the differential amplifier circuit changes.

According to a second aspect of the present invention, the bias voltage generating circuit according to the first aspect of the present invention further comprises a second constant current generating part, a fourth transistor of the second conductivity type and a fifth transistor of the first conductivity type. The second constant current generating part generates other constant current of a similar value to that of the constant current generated in the first current generating part. The fourth transistor includes a first current electrode to which the second potential is supplied through the second constant current generating part, a second current electrode and a control electrode. The fifth transistor includes a first current electrode to which the first potential is supplied, a second current electrode connected with the second current electrode of the fourth transistor and a control electrode connected with the second current electrode of the fourth transistor. The other constant current flows between the first and second current electrodes of the fourth transistor and between the first and second current electrodes of the fifth transistor. The voltage signal is inputted to the control electrode of the fourth transistor. A potential at the second current electrode of the fifth transistor functions as a second bias voltage.

According to a third aspect of the present invention, the bias voltage generating circuit according to the first aspect of the present invention further comprises seventh to ninth transistors. The seventh transistor of the second conductivity type includes a first current electrode to which the second potential is supplied, a second current electrode and a control electrode connected with the control electrode of the second transistor. The eighth transistor of the second conductivity type includes a first current electrode connected with the second current electrode of the seventh transistor, a second current electrode and a control electrode. The ninth transistor of the first conductivity type includes a first current electrode to which the first potential is supplied, a second current electrode connected with the second current electrode of the eighth transistor and a control electrode connected with the second current electrode of the eighth transistor. The second transistor and the seventh transistor constitute a fourth current mirror circuit. The fourth current mirror circuit generates other constant current of a similar value to that of the constant current. The other constant current flows between the first and second current electrodes of the eighth transistor and between the first and second current electrodes of the ninth transistor. The voltage signal is inputted to the control electrode of the eighth transistor. A potential at the second current electrode of the ninth transistor functions as a second bias voltage.

According to a fourth aspect of the present invention, a differential amplifier has a bias voltage generating circuit according to the first aspect of the present invention and a differential amplifier circuit which includes a tenth transistor including a first and a second current electrodes and a control electrode as a constant current circuit. A reference voltage signal and an input voltage signal are inputted to the differential amplifier circuit. The reference voltage signal is also inputted to the control electrode of the first transistor as the voltage signal. The first bias voltage is inputted to the control electrode of the tenth transistor.

The differential amplifier has the bias voltage generating circuit according to the first aspect of the present invention and the differential amplifier circuit. Moreover, the reference voltage signal to the differential amplifier circuit is also inputted to the control electrode of the first transistor, and the first bias voltage is inputted to the control electrode of the tenth transistor which is a constant current circuit. The bias voltage generating circuit has a feedback action ensuring a constant current value through the constant current circuit included in the differential amplifier circuit. Accordingly, the differential amplifier which can ensure a constant current through the constant current circuit in the differential amplifier circuit is attainable, even in case that a common mode voltage of the reference voltage signal to the differential amplifier circuit changes.

According to a fifth aspect of the present invention, a differential amplifier has a bias voltage generating circuit according to the second aspect of the present invention, a differential amplifier circuit having an eleventh transistor of the second conductivity type including a first and a second current electrodes as a constant current circuit and a control electrode and other differential amplifier circuit having a twelfth transistor of the first conductivity type including a first and a second current electrodes and a control electrode as other constant current circuit. Both a reference voltage signal and an input voltage signal are inputted to the differential amplifier circuit and the other differential amplifier circuit, respectively. The reference voltage signal is also inputted to the control electrodes of the first and fourth transistors as the voltage signal, respectively. The first bias voltage is inputted to the control electrode of the eleventh transistor. The second bias voltage is inputted to the control electrode of the twelfth transistor.

The differential amplifier has the bias voltage generating circuit according to the second aspect of the present invention, the differential amplifier circuit and the other differential amplifier circuit. Moreover, the reference voltage signal to the differential amplifier circuit and the other differential amplifier circuit is also inputted to the control electrodes of the first and the fourth transistors, and the first bias voltage is inputted to the control electrode of the eleventh transistor which is the constant current circuit. Moreover, the second bias voltage is inputted to the control electrode of the twelfth transistor which is the other constant current circuit. This bias voltage generating circuit has a feedback action ensuring a constant current value in the constant current circuit in the differential amplifier circuit and a constant current value in the other constant current circuit in the other differential amplifier circuit. In other words, the differential amplifier which can ensure constant currents in the constant current circuit and in the other constant current circuit is attainable, even in case that a common mode voltage of the reference voltage signal to the differential amplifier circuit and the other differential amplifier circuit changes. Moreover, the differential amplifier according to the present aspect has the differential amplifier circuit and the other differential amplifier circuit which include the constant current circuit and the other constant current circuit of the different conductivity type, respectively. Accordingly, even if there is an influence upon a constant current flowing in one of the constant current circuit and the other constant current circuit, a stability of a constant current flowing in the other is improved. In other words, even in case that an operational reliability of one of the differential amplifier circuit and the other differential amplifier circuit decreases, an operational reliability of the other part is improved, thus a differential voltage detection can certainly be performed with applying a signal of the differential amplifier circuit of higher operational reliability corresponding to an aptitude of a fluctuation of the reference voltage signal.

According to a sixth aspect of the present invention, a differential amplifier has a bias voltage generating circuit according to the third aspect of the present invention, a differential amplifier circuit including a thirteenth transistor of the second conductivity type including a first and a second current electrodes and a control electrode as a constant current circuit and other differential amplifier circuit including a fourteenth transistor of the first conductivity type including a first and a second current electrodes and a control electrode as other constant current circuit. Both a reference voltage signal and an input voltage signal are inputted to the differential amplifier circuit and the other differential amplifier circuit, respectively. The reference voltage signal is also inputted to the control electrodes of the first and eighth transistors, respectively. The first bias voltage is inputted to the control electrode of the thirteenth transistor. The second bias voltage is inputted to the control electrode of the fourteenth transistor.

The differential amplifier has the bias voltage generating circuit according to the third aspect of the present invention, the differential amplifier circuit and the other differential amplifier circuit. Moreover, the reference voltage signal to the differential amplifier circuit and the other differential amplifier circuit is also inputted to the control electrodes of the first and the eighth transistors, and the first bias voltage is inputted to the control electrode of the thirteenth transistor which is the constant current circuit. Moreover, the second bias voltage is inputted to the control electrode of the fourteenth transistor which is the other constant current circuit. This bias voltage generating circuit has a feedback action ensuring a constant current value in the constant current circuit in the differential amplifier circuit and a constant current value in the other constant current circuit in the other differential amplifier circuit. In other words, the differential amplifier which can ensure constant currents in the constant current circuit and the other constant current circuit is attainable, even in case that a common mode voltage of the reference voltage signal to the differential amplifier circuit and the other differential amplifier circuit changes. Moreover, the differential amplifier according to the present aspect has the differential amplifier circuit and the other differential amplifier circuit which include the constant current circuit and the other constant current circuit of the different conductivity type, respectively. Accordingly, even if there is an influence upon a constant current flowing in one of the constant current circuit and the other constant current circuit, a stability of a constant current flowing in the other is improved. In other words, even in case that an operational reliability of one of the differential amplifier circuit and the other differential amplifier circuit decreases, an operational reliability of the other is improved, thus a differential voltage detection can certainly be performed with applying a signal of the differential amplifier circuit of higher operational reliability corresponding to an aptitude of a fluctuation of the reference voltage signal.

These and other objects, features, aspects and advantages of the present invention will become more apparent from the following detailed description of the present invention when taken in conjunction with the accompanying drawings.

DESCRIPTION OF THE PREFERRED EMBODIMENTS

<Preferred Embodiment 1>

The present preferred embodiment is a differential amplifier including a differential amplifier circuit and a bias voltage generating circuit. The bias voltage generating circuit ensures a constant current through a constant current circuit in the differential amplifier circuit even in case that a common mode voltage of a reference voltage signal to the differential amplifier circuit changes.

Figure 1:
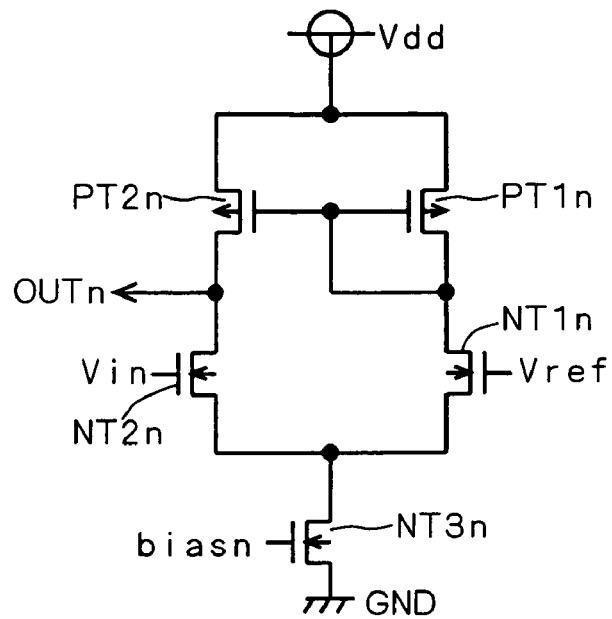
FIG. 1 is a drawing illustrating a differential amplifier circuit of a differential amplifier according to a preferred embodiment 1.
Figure 2:
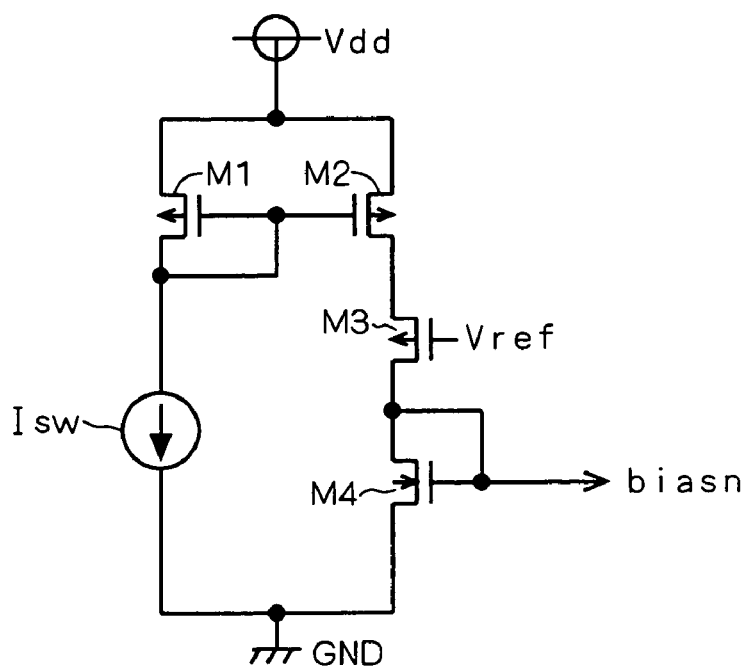
FIG. 2 is a drawing illustrating a bias voltage generating circuit of the differential amplifier according to the preferred embodiment 1.

FIG. 1 is a drawing illustrating the differential amplifier circuit in the differential amplifier according to the present preferred embodiment. Moreover, FIG. 2 is a drawing illustrating the bias voltage generating circuit in the differential amplifier according to the present preferred embodiment.

As shown in FIG. 1, the differential amplifier circuit includes Pch MOS (P-channel Metal Oxide Semiconductor) transistors PT1$n$ and PT2$n$ and Nch MOS transistors NT1$n$ to NT3$n$.

A source potential Vdd is supplied to sources of the Pch MOS transistors PT1$n$ and PT2$n$ in common, and those gates are connected with each other. The gate of the Pch MOS transistor PT1$n$ is connected with not only a drain of the Pch MOS transistor PT1$n$ but also a drain of the Nch MOS transistor NT1$n$. Moreover, a drain of the Pch MOS transistor PT2$n$ is connected with a drain of the Nch MOS transistor NT2$n$.

A drain of a Nch MOS transistor NT3$n$ is connected with sources of the Nch MOS transistors NT1$n$ and NT2$n$ in common. A ground potential GND is supplied to a source of the Nch MOS transistor NT3$n$.

The Pch MOS transistors PT1$n$ and PT2$n$ constitute a current mirror circuit and let a mirror current of a similar value to that of a reference current flowing between the drain and the source of the Nch MOS transistor NT1$n$ flow between the drain and the source of the Nch MOS transistor NT2$n$. A reference voltage signal Vref is inputted to a gate of the Nch MOS transistor NT1$n$, and an input voltage signal Vin is inputted to a gate of the Nch MOS transistor NT2$n$. Moreover, a bias voltage biasn generated in the bias voltage generating circuit in FIG. 2 is inputted to a gate of the Nch MOS transistor NT3$n$.

In this differential amplifier circuit, a potential of the drain of the Nch MOS transistor NT2$n$ functions as a differential detection signal OUTn. Moreover, the differential detection signal OUTn is amplified by an amplifier circuit (not shown) in the differential amplifier and becomes an output of the differential amplifier.

As shown in FIG. 2, the bias voltage generating circuit includes Pch MOS transistors M1 to M3, a Nch MOS transistor M4 and a current source Isw generating a constant current of a certain value. Besides, the current source Isw can be composed of a resistance, for example, and otherwise, it can also be composed of a self bias circuit employing a MOS transistor and so on.

The source potential Vdd is supplied to sources of the Pch MOS transistors M1 and M2 in common, and those gates are connected with each other. The gate of the Pch MOS transistor M1 is connected with not only a drain of the Pch MOS transistor M1 but also one terminal of the current source Isw. Moreover, a drain of the Pch MOS transistor M2 is connected with a source of the Pch MOS transistor M3.

A drain of the Pch MOS transistor M3 is connected with a drain and a gate of the Nch MOS transistor M4. Moreover, the ground potential GND is supplied to a source of the Nch MOS transistor M4 and other terminal of the current source Isw.

The Pch MOS transistors M1 and M2 constitute a current mirror circuit and let a mirror current of the similar value to that of a constant current generated by the current source Isw flow between the source and the drain of the Pch MOS transistor. M3 and between the drain and the source of the Nch MOS transistor M4. In other words, the current source Isw and the current mirror circuit composed of the Pch MOS transistors M1 and M2 function as a constant current generating part generating the constant current.

Besides, the reference voltage signal Vref which is also supplied to the Nch MOS transistor NT1$n$ of the differential amplifier circuit in FIG. 1 is inputted to a gate of the Pch MOS transistor M3. Moreover, a drain potential of the Nch MOS transistor M4 functions as a bias voltage biasn.

In this bias voltage generating circuit, when an absolute value of the reference voltage signal Vref changes, a voltage between the gate and the source of the Pch MOS transistor M3 changes. According to this, a voltage drop amount between the drain and the source of the Pch MOS transistor M3 changes, and the bias voltage biasn can be made to change.

For example, a value of the source voltage Vdd is set at 1.5 [V], and an initial value of the reference voltage signal Vref is set at 0.75 [V], for example. At this time, when a common mode voltage of the reference voltage signal Vref decreases, the absolute value of the voltage between the gate and the source of the Pch MOS transistor M3 is supposed to increase.

Then, in order to continue maintaining the mirror current flowing between the drain and the source of the Pch MOS transistor M3, the absolute value of the voltage between the drain and the source of the Pch MOS transistor M3 decreases. When the absolute value of the voltage between the drain and the source of the Pch MOS transistor M3 decreases, the drain potential of the Nch MOS transistor M4 is supposed to rise. In other words, the bias voltage biasn rises.

Thus, in the differential amplifier circuit in FIG. 1, even if the common mode voltage of the reference voltage signal Vref decreases and the current flowing through the Nch MOS transistor NT3n decreases, the bias voltage biasn to the Nch MOS transistor NT3n rises and thus the current flowing through the Nch MOS transistor NT3n increases, and the bias voltage generating circuit in FIG. 2 has a feedback action ensuring a constant current value through the Nch MOS transistor NT3n which is a constant current circuit.

Thus, even in case that the common mode voltage of the reference voltage signal Vref to the differential amplifier circuit changes, the bias voltage generating circuit and the differential amplifier which can ensure the constant current through the constant current circuit in the differential amplifier circuit are attainable.

Besides, in the present preferred embodiment, a current of a certain value is generated in the current source Isw, the constant current flows to the Pch MOS transistor M3 and the Nch MOS transistor M4 through the current mirror circuit composed of the Pch MOS transistors M1 and M2.

In order to attain the feedback action described above, the constant current has to only flow through the Pch MOS transistor M3 and the Nch MOS transistor M4, thus it is also applicable to omit the current mirror circuit composed of the Pch MOS transistors M1 and M2 and constitute the current source Isw to be placed in a position of the Pch MOS transistor M2 in the bias voltage generating circuit in FIG. 2.

However, in case that a potential difference between the source potential Vdd and the ground potential GND is small as an exemplification of 1.5 [V] described above, if the current source Isw is connected with the Pch MOS transistor M3 and the Nch MOS transistor M4 in series and is made to function as the constant current generating part, there is a possibility that an operating voltage of the Pch MOS transistor M3 and the Nch MOS transistor M4 is not ensured and thus both the transistors are not activated by reason that the voltage drop amount in the current source Isw is too large.

When the mirror current of the similar value to that of the current generated in the current source Isw is made to flow to the Pch MOS transistor M3 and the Nch MOS transistor M4 through the current mirror circuit such as the bias voltage generating circuit described in the present preferred embodiment, the voltage drop amount in the current source Isw does not have influence on the operating voltages of the Pch MOS transistor M3 and the Nch MOS transistor M4, even in case that the potential difference between the source potential Vdd and the ground potential GND is small. Thus, the bias voltage generating circuit of high operational reliability is attainable.

<Preferred Embodiment 2>

The present preferred embodiment is a modification example of the differential amplifier according to the preferred embodiment 1, and is a modification of the composition of the differential amplifier circuit and the bias voltage generating circuit in the preferred embodiment 1.

Figure 3:
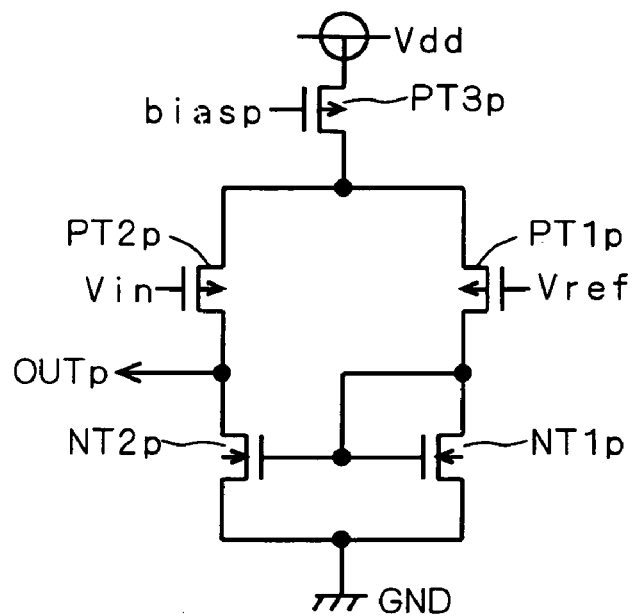
FIG. 3 is a drawing illustrating a differential amplifier circuit of a differential amplifier according to a preferred embodiment 2.
Figure 4:
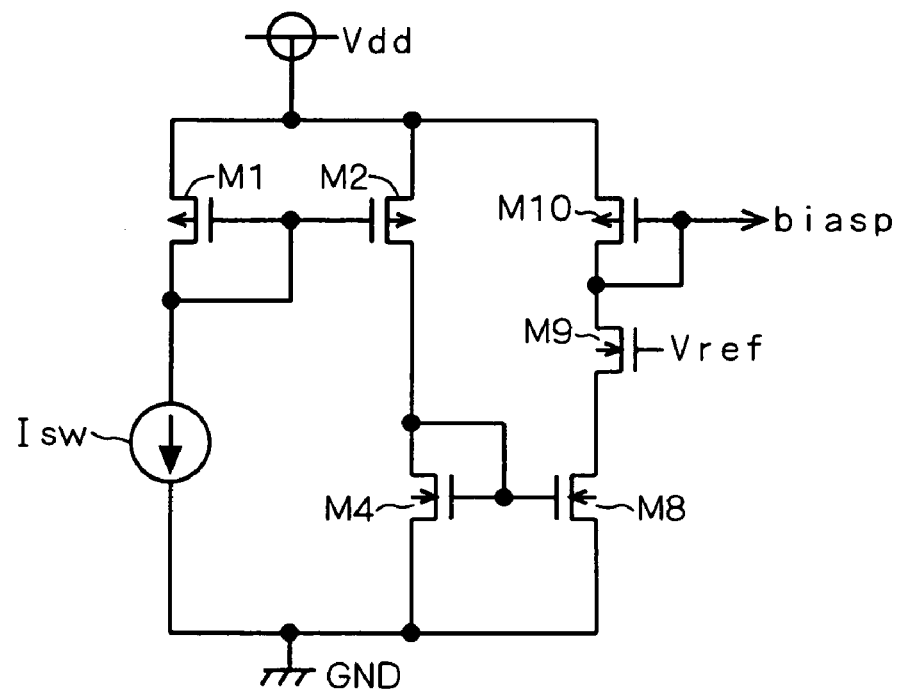
FIG. 4 is a drawing illustrating a bias voltage generating circuit of the differential amplifier according to the preferred embodiment 2.

FIG. 3 is a drawing illustrating a differential amplifier circuit in a differential amplifier according to the present preferred embodiment. Moreover, FIG. 4 is a drawing illustrating a bias voltage generating circuit in the differential amplifier according to the present preferred embodiment.

As shown in FIG. 3, the differential amplifier circuit includes Nch MOS transistors NT1p and NT2p and Pch MOS transistors PT1p to PT3p.

The ground potential GND is supplied to sources of the Nch MOS transistors NT1p and NT2p in common, and those gates are connected with each other. The gate of the Nch MOS transistor NT1p is connected with not only a drain of the Nch MOS transistor NT1p but also a drain of the Pch MOS transistor PT1p. Moreover, a drain of the Nch MOS transistor NT2p is connected with a drain of the Pch MOS transistor PT2p.

A drain of the Pch MOS transistor PT3p is connected with sources of the Pch MOS transistors PT1p and PT2p in common. The source potential Vdd is supplied to a source of the Pch MOS transistor PT3p.

The Nch MOS transistors NT1p and NT2p constitute a current mirror circuit and let a mirror current of a similar value to that of a reference current flowing between the drain and the source of the Pch MOS transistor PT1p flow between the drain and the source of the Pch MOS transistor PT2p. The reference voltage signal Vref is inputted to a gate of the Pch MOS transistor PT1p, and the input voltage signal Vin is inputted to a gate of the Pch MOS transistor PT2p. Moreover, a bias voltage biasp generated in a bias voltage generating circuit in FIG. 4 is inputted to a gate of the Pch MOS transistor PT3p.

In this differential amplifier circuit, a potential of the drain of the Pch MOS transistor PT2p functions as a differential detection signal OUTp. Moreover, the differential detection signal OUTp is amplified by an amplifier circuit (not shown) in the differential amplifier and becomes an output of the differential amplifier.

As shown in FIG. 4, the bias voltage generating circuit includes Pch MOS transistors M1, M2, M10, Nch MOS transistors M4, M8, M9 and a current source Isw generating a constant current of a certain value. Besides, in the same manner as described in the preferred embodiment 1, the current source Isw can be composed of a resistance, for example, and otherwise, it can also be composed of a self bias circuit employing a MOS transistor and so on.

The source potential Vdd is supplied to sources of the Pch MOS transistors M1 and M2 in common, and those gates are connected with each other. The gate of the Pch MOS transistor M1 is connected with not only a drain of the Pch MOS transistor M1 but also one terminal of the current source Isw. Moreover, a drain of the Pch MOS transistor M2 is connected with a drain and a gate of the Nch MOS transistor M4. Moreover, the ground potential GND is supplied to a source of the Nch MOS transistor M4 and other terminal of the current source Isw.

A source of the Nch MOS transistor M8 is connected with the source of the Nch MOS transistor M4. A gate of the Nch MOS transistor M8 is connected with the gate of the Nch MOS transistor M4. A drain of the Nch MOS transistor M8 is connected with a source of the Nch MOS transistor M9.

A drain of the Nch MOS transistor M9 is connected with a drain and a gate of the Pch MOS transistor M10. Moreover, the source potential Vdd is supplied to a source of the Pch MOS transistor M10.

The Pch MOS transistors M1 and M2 constitute a current mirror circuit and let a mirror current of the similar value to that of a constant current generated by the current source Isw flow between the drain and the source of the Nch MOS transistor M4. Moreover, the Nch MOS transistors M4 and M8 also constitute a current mirror circuit and let a mirror current of the similar value to that of the mirror current flowing through the Nch MOS transistor M4 flow between the source and the drain of the Pch MOS transistor M10 and between the drain and the source of the Nch MOS transistor M9.

In other words, the current source Isw, the current mirror circuit composed of the Pch MOS transistors M1 and M2 and the current mirror circuit composed of the Nch MOS transistors M4 and M8 function as a constant current generating part generating the constant current.

Besides, the reference voltage signal Vref which is also supplied to the Pch MOS transistor PT1$p$ in the differential amplifier circuit in FIG. 3 is inputted to a gate of the Nch MOS transistor M9. Moreover, a drain potential of the Pch MOS transistor M10 functions as the bias voltage biasp.

In this bias voltage generating circuit, when the absolute value of the reference voltage signal Vref changes, a voltage between the gate and the source of the Nch MOS transistor M9 changes. According to this, a voltage drop amount between the drain and the source of the Nch MOS transistor M9 changes, the bias voltage biasp can be made to change.

For example, the value of the source voltage Vdd is set at 1.5 [V], and the initial value of the reference voltage signal Vref is set at 0.75 [V], for example. At this time, when the common mode voltage of the reference voltage signal Vref decreases, the absolute value of the voltage between the gate and the source of the Nch MOS transistor M9 is supposed to decrease.

Then, in order to continue maintaining the mirror current flowing between the drain and the source of the Nch MOS transistor M9, the absolute value of the voltage between the drain and the source of the Nch MOS transistor M9 increases. When the absolute value of the voltage between the drain and the source of the Nch MOS transistor M9 increases, the drain potential of the Pch MOS transistor M10 is supposed to rise. In other words, the bias voltage biasp rises.

Thus, in the differential amplifier circuit in FIG. 3, even if the common mode voltage of the reference voltage signal Vref decreases and the current flowing through the Pch MOS transistor PT3$p$ increases, the bias voltage biasp to the Pch MOS transistor PT3$p$ rises and thus the current flowing through the Pch MOS transistor PT3$p$ is depressed, and the bias voltage generating circuit in FIG. 4 has a feedback action ensuring a constant current value in the Pch MOS transistor PT3$p$ which is a constant current circuit.

Thus, even in case that the common mode voltage of the reference voltage signal Vref to the differential amplifier circuit changes, the bias voltage generating circuit and the differential amplifier which can ensure the constant current through the constant current circuit in the differential amplifier circuit is attainable.

Besides, also in the present preferred embodiment, the mirror current of a similar value to that of the current generated in the current source Isw flows to the Nch MOS transistor M9 and the Pch MOS transistor M10 through the two current mirror circuits. According to this, in the same manner as the case of the preferred embodiment 1, the voltage drop amount in the current source Isw does not have influence on the operating voltages of the Nch MOS transistor M9 and the Pch MOS transistor M10, even in case that the potential difference between the source potential Vdd and the ground potential GND is small. Thus, bias voltage generating circuit of high operational reliability is attainable.

<Preferred Embodiment 3>

The present preferred embodiment is a differential amplifier that the preferred embodiments 1 and 2 are joined.

In the preferred embodiment, both the differential amplifier circuits described in FIGS. 1 and 3 are employed. Besides, FIG. 5 is a drawing illustrating a bias voltage generating circuit in the differential amplifier according to the present preferred embodiment.

Figure 5:
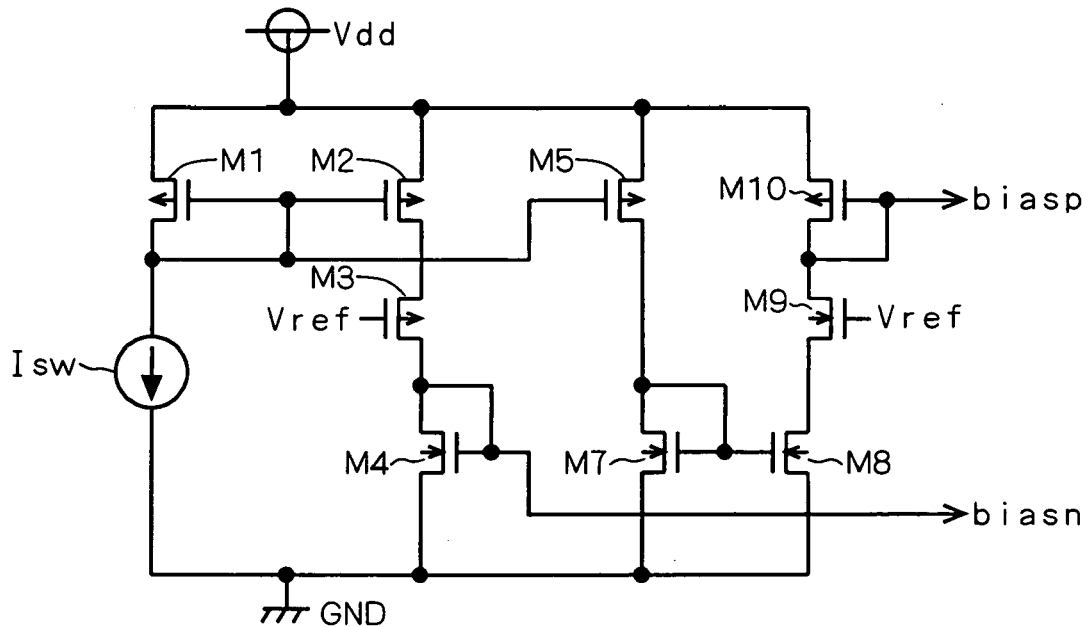
FIG. 5 is a drawing illustrating a bias voltage generating circuit of a differential amplifier according to a preferred embodiment 3.

As shown in FIG. 5, the bias voltage generating circuit includes Pch MOS transistors M1 to M3, M5 and M10, Nch MOS transistors M4, M7 to M9 and a current source Isw generating a constant current of the certain value. Besides, in the same manner as described in the preferred embodiment 1, the current source Isw can be composed of a resistance, for example, and otherwise, it can also be composed of a self bias circuit employing a MOS transistor and so on.

A composition of circuits of the Pch MOS transistors M1 to M3, the Nch MOS transistor M4 and the current source Isw is exactly the same as the case of the bias voltage generating circuit in FIG. 2, thus the description is omitted.

The source potential Vdd is supplied to a source of the Pch MOS transistor M5, and a gate of it is connected with the gate of the Pch MOS transistor M1. Moreover, a drain of the Pch MOS transistor M5 is connected with a drain and a gate of the Nch MOS transistor M7. Moreover, the ground potential GND is supplied to a source of the Nch MOS transistor M7.

The source of the Nch MOS transistor M8 is connected with the source of the Nch MOS transistor M7. The gate of the Nch MOS transistor M8 is connected with the gate of the Nch MOS transistor M7. The drain of the Nch MOS transistor M8 is connected with the source of the Nch MOS transistor M9.

The drain of the Nch MOS transistor M9 is connected with the drain and the gate of the Pch MOS transistor M10. Moreover, the source potential Vdd is supplied to the source of the Pch MOS transistor M10.

The Pch MOS transistors M1 and M2 constitute the current mirror circuit and let the mirror current of the similar value to that of the constant current generated by the current source Isw flow between the source and the drain of the Pch MOS transistor M3 and between the drain and the source of the Nch MOS transistor M4. In other words, the current source Isw and the current mirror circuit composed of the Pch MOS transistors M1 and M2 function as a first constant current generating part generating the constant current.

Besides, the reference voltage signal Vref which is also supplied to the Nch MOS transistor NT1$n$ of the differential amplifier circuit in FIG. 1 and the Pch MOS transistor PT1$p$ of the differential amplifier circuit in FIG. 3 is inputted to the gate of the Pch MOS transistor M3. Moreover, the drain potential of the Nch MOS transistor M4 functions as the bias voltage biasn to the Nch MOS transistor NT3n of the differential amplifier circuit in FIG. 1.

Moreover, the Pch MOS transistors M1 and M5 constitute the current mirror circuit and let the mirror current of the similar value to that of the constant current generated by the current source Isw flow between the drain and the source of the Nch MOS transistor M7. Moreover, the Nch MOS transistors M7 and M8 also constitute the current mirror circuit and let the mirror current of the similar value to that of the mirror current flowing through the Nch MOS transistor M7 flow between the source and the drain of the Pch MOS transistor M10 and between the drain and the source of the Nch MOS transistor M9.

In other words, the current source Isw, the current mirror circuit composed of the Pch MOS transistors M1 and M5 and the current mirror circuit composed of the Nch MOS transistors M7 and M8 function as a second constant current generating part generating the constant current.

Besides, the reference voltage signal Vref which is also supplied to the Nch MOS transistor NT1n of the differential amplifier circuit in FIG. 1 and the Pch MOS transistor PT1p of the differential amplifier circuit in FIG. 3 is inputted to a gate of the Nch MOS transistor M9. Moreover, a drain potential of the Pch MOS transistor M10 functions as a bias voltage biasp.

In other words, in this voltage generating circuit, the Pch MOS transistors M1 to M3, the Nch MOS transistor M4 and the current source Isw function as the bias voltage generating circuit in FIG. 2, and the Pch MOS transistors M1, M5 and M10, the Nch MOS transistors M7 to M9 and the current source Isw function as the bias voltage generating circuit similar to that in FIG. 4.

According to the present preferred embodiment, the bias voltage generating circuit has the Nch MOS transistor M9 and the Pch MOS transistor M10 having an opposite conductivity type to the Pch MOS transistor M3 and the Nch MOS transistor M4. Thus, the bias voltage generating circuit in FIG. 5 has a feedback action ensuring the constant current value in the Nch MOS transistor NT3n which is the constant current circuit of the differential amplifier circuit in FIG. 1 and a feedback action ensuring the constant current value in the Pch MOS transistor PT3p which is the constant current circuit of the differential amplifier circuit in FIG. 3. According to this, even in case that the common mode voltage of the reference voltage signal Vref to the differential amplifier circuit changes, the bias voltage generating circuit and the differential amplifier which can ensure the constant current through the constant current circuit in the differential amplifier circuit are attainable.

In other words, even in case that the common mode voltage of the reference voltage signal Vref to the differential amplifier circuit in FIGS. 1 and 3 changes, the differential amplifier which can ensure the respective constant currents through the Nch MOS transistor MT3n and the Pch MOS transistor PT3p that are the respective constant current circuits is attainable.

Moreover, the differential amplifier according to the present preferred embodiment has the differential amplifier circuits in FIGS. 1 and 3 including the Nch MOS transistor NT3n and the Pch MOS transistor PT3p whose conductivity types are different with each other, respectively. Thus, even if the constant current flowing in one of the Nch MOS transistor NT3n and the Pch MOS transistor PT3p is under the influence corresponding to a fluctuation of the reference voltage signal Vref, the stability of the constant current flowing in the other is improved.

For example, if the common mode voltage of the reference voltage signal Vref decreases sharply, there is a possibility that it causes a decrease of the current flowing through the Nch MOS transistor NT3n in the differential amplifier circuit in FIG. 1, although the feedback action as described above operates. Or, there is also a possibility that the Nch MOS transistor NT3n stops the action without ensuring a threshold voltage of the Nch MOS transistor NT3n. Thus, a case of difficulty in ensuring the constant current through the Nch MOS transistor NT3n is considered.

In the meantime, in the differential amplifier circuit in FIG. 3, the sharp decrease of the reference voltage signal Vref only causes an increase of the current flowing through the Pch MOS transistor PT3p. Thus, the increase of that current can easily be depressed by the feedback action, and it is comparatively easy to ensure the constant current through the Pch MOS transistor PT3p.

On the contrary, in case that the common mode voltage of the reference voltage signal Vref increases sharply, it becomes comparatively difficult to ensure the constant current through the Pch MOS transistor PT3p, and it becomes comparatively easy to ensure the constant current through the Nch MOS transistor NT3n.

In other words, even in case that an operational reliability of one of the differential amplifier circuit in FIGS. 1 and 3 decreases, an operational reliability of the other is improved, thus a differential voltage detection can certainly be performed with applying a signal of the differential amplifier circuit of higher operational reliability corresponding to an aptitude of a fluctuation of the reference voltage signal Vref.

Besides, also in the present preferred embodiment, the mirror current of a similar value to that of the current generated in the current source Isw flows to the Pch MOS transistor M3 and the Nch MOS transistor M4 through the current mirror circuit, and the mirror current of a similar value to that of the current generated in the current source Isw flows to the Nch MOS transistor M9 and the Pch MOS transistor M10 through the two current mirror circuits. According to this, in the same manner as the case of the preferred embodiments 1 and 2, the voltage drop amount in the current source Isw does not have influence on the operating voltage of the Pch MOS transistor M3, the Nch MOS transistor M4, the Nch MOS transistor M9 and the Pch MOS transistor M1, even in case that the potential difference between the source potential Vdd and the ground potential GND is small. Thus, bias voltage generating circuit of high operational reliability is attainable.

Figure 6:
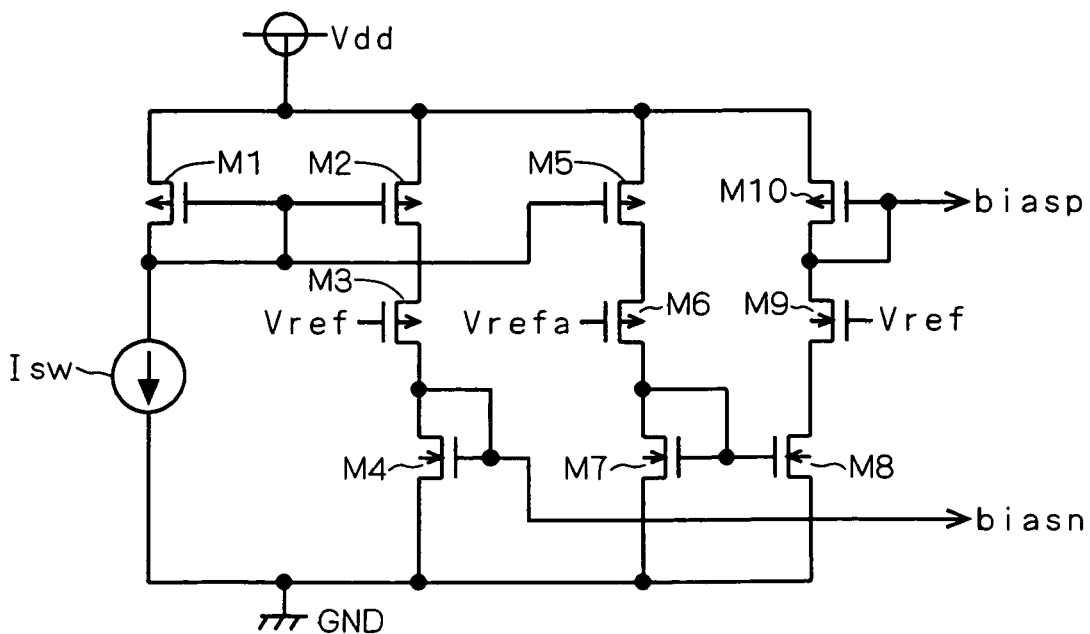
FIG. 6 is a drawing illustrating a modification example of the bias voltage generating circuit of the differential amplifier according to the preferred embodiment 3.

Besides, as shown in FIG. 6, it is also applicable to make a Pch MOS transistor M6 stand between the current mirror circuit composed of the Pch MOS transistors M1 and M5 and the current mirror circuit composed of the Nch MOS transistors M7 and M8 and to let the mirror current from the Pch MOS transistor M5 flow between the source and the drain of the Pch MOS transistor M6.

A fixed voltage signal Vrefa which is a fixed value is inputted to a gate of the Pch MOS transistor M6. A value similar to the initial value of the reference voltage signal Vref is applicable to this fixed voltage signal Vrefa (in case that the Vdd is set at 1.5 [V], for example, it can be set at 0.75 [V], for example). A method to take out a potential at a part of a resistance placed between the source potential Vdd and the ground potential GND is applicable to a generation of the fixed voltage signal Vrefa, for example.

Or, the reference voltage signal Vref can be inputted to the gate of the Pch MOS transistor M6 instead of the fixed voltage signal Vrefa.

In this case, when coordinating an electrical characteristic of the Pch MOS transistor M2 with an electrical characteristic of the Pch MOS transistor M5, coordinating an electrical characteristic of the Pch MOS transistor M3 with an electrical characteristic of the Pch MOS transistor M6, coordinating an electrical characteristic of the Nch MOS transistor M4 with an electrical characteristic of the Nch MOS transistor M7 and setting the value of the fixed voltage signal Vrefa to be the same as that of the reference voltage signal Vref, an electrical characteristic of a route passing the mirror current through the Pch MOS transistor M3 and an electrical characteristic of a route passing the mirror current through the Pch MOS transistor M6 coincide at high precision. According to this, both the mirror currents coincide with each other at high precision.

Besides, when employing the fixed voltage signal Vrefa, the current flowing in the Pch MOS transistor M6 can be fixed to be a constant value.

<Preferred Embodiment 4>

The present preferred embodiment is a modification example of the bias voltage generating circuit according to the preferred embodiment 2, and a Nch MOS transistor M11 is made to stand between the current mirror circuit composed of the Pch MOS transistors M1 and M2 and the current mirror circuit composed of the Nch MOS transistors M4 and M8 and the mirror current from the Pch MOS transistor M2 is made to flow between the source and the drain of the Nch MOS transistor M11.

Figure 7:
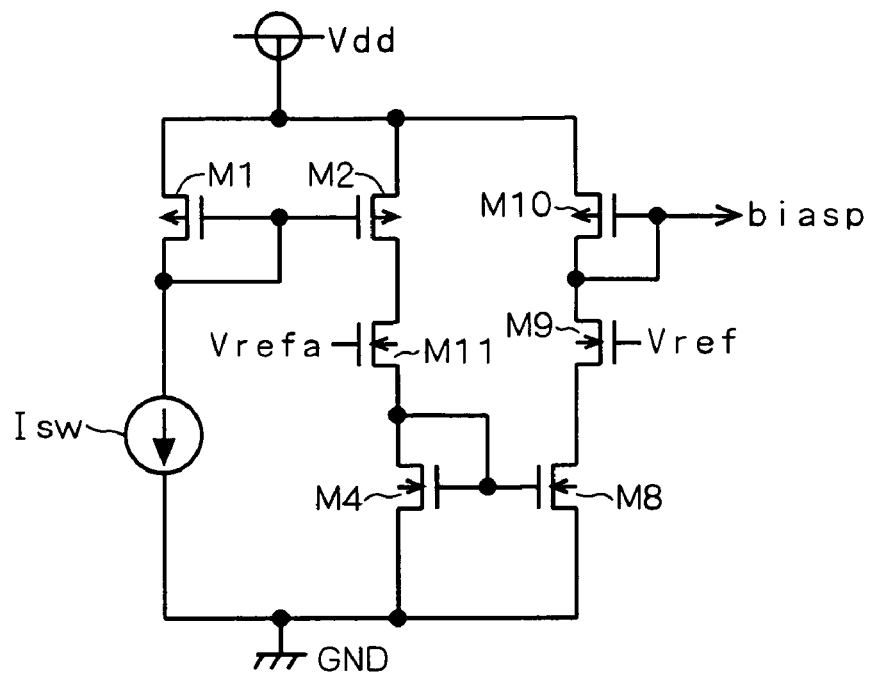
FIG. 7 is a drawing illustrating a bias voltage generating circuit of a differential amplifier according to a preferred embodiment 4.

FIG. 7 is a drawing illustrating a bias voltage generating circuit in a differential amplifier according to the present preferred embodiment. The fixed voltage signal Vrefa which is the fixed value is inputted to a gate of the Nch MOS transistor M11. The value similar to the initial value of the reference voltage signal Vref is applicable to this fixed voltage signal Vrefa (in case that the Vdd is set at 1.5 [V], for example, it can be set at 0.75 [V], for example). The method to take out the potential at a part of the resistance placed between the source potential Vdd and the ground potential GND is applicable to the generation of the fixed voltage signal Vrefa, for example.

Or, the reference voltage signal Vref can be inputted to the gate of the Nch MOS transistor M11 instead of the fixed voltage signal Vrefa.

In the same manner as the case of FIG. 6, when coordinating the electrical characteristic of the Pch MOS transistor M2 with an electrical characteristic of the Pch MOS transistor M10, coordinating an electrical characteristic of the Nch MOS transistor M9 with an electrical characteristic of the Nch MOS transistor M11 and setting the value of the fixed voltage signal Vrefa to be the same as that of the reference voltage signal Vref, an electrical characteristic of a route passing the mirror current through the Nch MOS transistor M9 and an electrical characteristic of a route passing the mirror current through the Nch MOS transistor M11 coincide at high precision. According to this, both the mirror currents coincide with each other at high precision.

Besides, when employing the fixed voltage signal Vrefa, the current flowing in the Nch MOS transistor M11 can be fixed to be a constant value.

The other points are similar to that of the bias voltage generating circuit in the differential amplifier according to the preferred embodiment 2, thus the description is omitted.

<Preferred Embodiment 5>

In the same manner as the preferred embodiment 3, the present preferred embodiment is also a differential amplifier which can generate both the bias voltage biasn and biasp. However, in the present preferred embodiment, a current mirror circuit is not placed separately with the Nch MOS transistor M4 generating the bias voltage biasn such as the case of FIGS. 5 and 6, but the Nch MOS transistor M4 is also made to take a role of the current mirror circuit.

Figure 8:
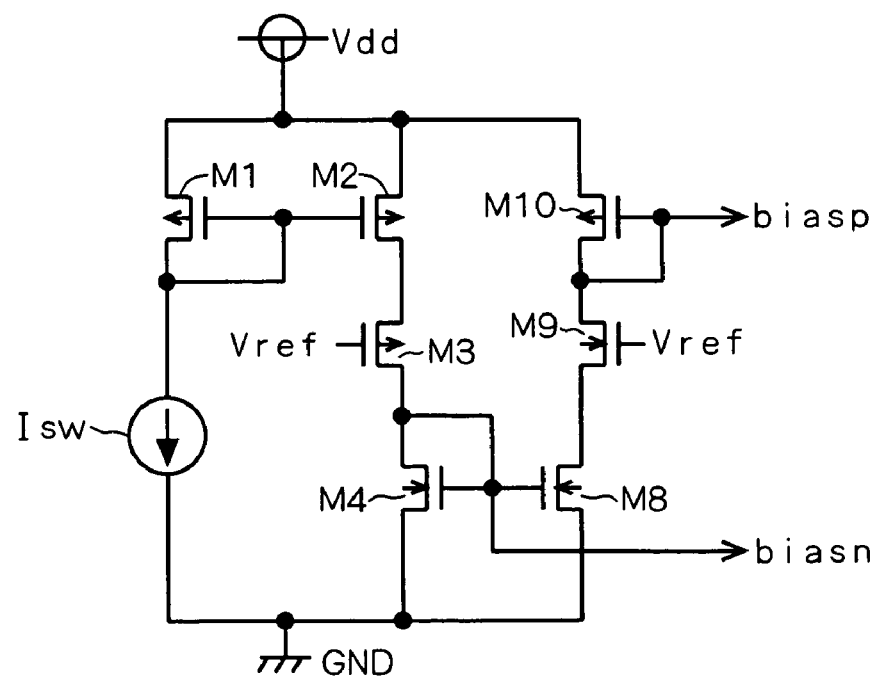
FIG. 8 is a drawing illustrating a bias voltage generating circuit of a differential amplifier according to a preferred embodiment 5.

FIG. 8 is a drawing illustrating a bias voltage generating circuit in a differential amplifier according to the present preferred embodiment. As shown in FIG. 8, the bias voltage generating circuit includes the Pch MOS transistors M1 to M3 and M10, the Nch MOS transistors M4, M8 and M9 and the current source Isw generating the constant current of the certain value. Besides, in the same manner as described in the preferred embodiment 1, the current source Isw can be composed of the resistance, for example, and otherwise, it can also be composed of the self bias circuit employing the MOS transistor and so on.

The composition of circuits of the Pch MOS transistors M1 to M3, the Nch MOS transistor M4 and the current source Isw is exactly the same as the case of the bias voltage generating circuit in FIG. 2, thus the description is omitted. Moreover, a composition of circuits of the Nch MOS transistors M8 and M9 and the Pch MOS transistor M10 is exactly the same as the case of the bias voltage generating circuit in FIG. 4, thus the description is also omitted.

In case of the present preferred embodiment, the drain potential of the Nch MOS transistor M4 functions as the bias voltage biasn to the Nch MOS transistor NT3n of the differential amplifier circuit in FIG. 1. Herewith, the Nch MOS transistors M4 and M8 constitute a current mirror circuit and let the mirror current of the similar value to that of the mirror current flowing through the Nch MOS transistor M4 flow between the source and the drain of the Pch MOS transistor M10 and between the drain and the source of the Nch MOS transistor M9. Moreover, the drain potential of the Pch MOS transistor M10 functions as the bias voltage biasp to the Pch MOS transistor PT3p of the differential amplifier circuit in FIG. 3.

According to the present preferred embodiment, the bias voltage generating circuit has the Nch MOS transistor M9 and the Pch MOS transistor M10 having the opposite conductivity type to the Pch MOS transistor M3 and the Nch MOS transistor M4. Thus, in the same manner as the case of FIGS. 5 and 6, the bias voltage generating circuit in FIG. 8 has the feedback action ensuring the constant current value in the Nch MOS transistor NT3n which is the constant current circuit of the differential amplifier circuit in FIG. 1 and the feedback action ensuring the constant current value in the Pch MOS transistor PT3p which is the constant current circuit of the differential amplifier circuit in FIG. 3. According to this, even in case that the common mode voltage of the reference voltage signal Vref to the differential amplifier circuit changes, the bias voltage generating circuit and the differential amplifier which can ensure the constant current through the constant current circuit in the differential amplifier circuit are attainable.

In other words, even in case that the common mode voltage of the reference voltage signal Vref to the differential amplifier circuit in FIGS. 1 and 3 changes, the differential amplifier which can ensure the respective constant currents through the Nch MOS transistor NT3n and the Pch MOS transistor PT3p that are the respective constant current circuits is attainable.

Moreover, the differential amplifier according to the present preferred embodiment has the differential amplifier circuits in FIGS. 1 and 3 including the Nch MOS transistor NT3n and the Pch MOS transistor PT3p whose conductivity types are different with each other, respectively. Thus, even if the constant current flowing in one of the Nch MOS transistor NT3n and the Pch MOS transistor PT3p is under the influence corresponding to the fluctuation of the reference voltage signal Vref, the stability of the constant current flowing in the other is improved.

In other words, even in case that the operational reliability of one of the differential amplifier circuit in FIGS. 1 and 3 decreases, the operational reliability of the other is improved, thus a differential voltage detection can certainly be performed with applying the signal of the differential amplifier circuit of higher operational reliability corresponding to the aptitude of the fluctuation of the reference voltage signal Vref.

<Modification Example>

In the present embodiments 1 to 5 described above, the MOS transistor is applied to a transistor, and otherwise, a bipolar transistor and so on, for example, are also applicable. Also in that case, the similar effect to that described above is attainable.

Moreover, in the bias voltage generating circuit in FIG. 2, when replacing all of the Pch MOS transistors M1 to M3 with the Nch MOS transistors, replacing the Nch MOS transistor M4 with the Pch MOS transistor, exchanging the source potential Vdd and the ground potential GND and converting a direction of a flow of the constant current generated in the current source Isw, the bias voltage biasn can be made to function as the bias voltage biasp.

The same is also applied in the bias voltage generating circuits in FIGS. 4 to 8.

While the invention has been shown and described in detail, the foregoing description is in all aspects illustrative and not restrictive. It is therefore understood that numerous modifications and variations can be devised without departing from the scope of the invention.

What is claimed is:

1. A bias voltage generating circuit, comprising:
a first current generating part generating a current;
a first transistor of a first conductivity type including a first current electrode to which a first potential is supplied through said first current generating part, a second current electrode and a control electrode;
a second transistor of a second conductivity type different from said first conductivity type including a first current electrode to which a second potential different from said first potential is supplied, a second current electrode connected with said second current electrode of said first transistor and a control electrode connected with said second current electrode of said first transistor, wherein
said current flows between said first and second current electrodes of said first transistor and between said first and second current electrodes of said second transistor,
a voltage signal is inputted to said control electrode of said first transistor,
a potential at said second current electrode of said second transistor functions as a first bias voltage,
said bias voltage generating circuit further comprising:
a second current generating part generating other current of a similar value to that of said current generated in said first current generating part;
a third transistor of said second conductivity type including a first current electrode to which said second potential is supplied through said second current generating part, a second current electrode and a control electrode, and
a fourth transistor of said first conductivity type including a first current electrode to which said first potential is supplied, a second current electrode connected with said second current electrode of said third transistor and a control electrode connected with said second current electrode of said third transistor, wherein
said other current flows between said first and second current electrodes of said third transistor and between said first and second current electrodes of said fourth transistor,
said voltage signal is inputted to said control electrode of said third transistor, and
a potential at said second current electrode of said fourth transistor functions as a second bias voltage;
said first current generating part includes,
a current source generating a current of a certain value, and
a first current mirror circuit to which said first potential is supplied, generating a first mirror current of a similar value to that of said current generated in said current source and allowing said first mirror current flow to said first current electrode of said first transistor as said current; and
said second current generating part includes,
said current source,
a second current mirror circuit to which said first potential is supplied and generating a second mirror current of a similar value to that of said current generated in said current source, and
a third current mirror circuit to which said second potential is supplied, generating a third mirror current of a similar value to that of said second mirror current and allowing said third mirror current flow to said first current electrode of said third transistor as said other current;
said bias voltage generating circuit further comprising:
a fifth transistor of said first conductivity type standing between said second and third current mirror circuits and including a first and a second current electrodes and a control electrode, wherein
said second mirror current flows between said first and second current electrodes of said fifth transistor,
said first current electrode of said fifth transistor is connected with said second current mirror circuit,
said second current electrode of said fifth transistor is connected with said third current mirror circuit; and
said voltage signal or other voltage signal is inputted to said control electrode of said fifth transistor.

2. A bias voltage generating circuit, comprising:
a first current generating part generating a current;
a first transistor of a first conductivity type including a first current electrode to which a first potential is supplied through said first current generating part, a second current electrode and a control electrode;
a second transistor of a second conductivity type different from said first conductivity type including a first current electrode to which a second potential different from said first potential is supplied, a second current electrode connected with said second current electrode of said first transistor and a control electrode connected with said second current electrode of said first transistor, wherein
said current flows between said first and second current electrodes of said first transistor and between said first and second current electrodes of said second transistor,
a voltage signal is inputted to said control electrode of said first transistor,
a potential at said second current electrode of said second transistor functions as a first bias voltage, said bias voltage generating circuit further comprising:
a third transistor of said second conductivity type including a first current electrode to which said second potential is supplied, a second current electrode and a control electrode connected with said control electrode of said second transistor;
a fourth transistor of said second conductivity type including a first current electrode connected with said second current electrode of said third transistor, a second current electrode and a control electrode; and
a fifth transistor of said first conductivity type including a first current electrode to which said first potential is supplied, a second current electrode connected with said second current electrode of said fourth transistor and a control electrode connected with said second current electrode of said fourth transistor, wherein
said second transistor and said third transistor constitute a first current mirror circuit,
said first current mirror circuit generates other current of a similar value to that of said current,
said other current flows between said first and second current electrodes of said fourth transistor and between said first and second current electrodes of said fifth transistor,
said voltage signal is inputted to said control electrode of said fourth transistor and
a potential at said second current electrode of said fifth transistor functions as a second bias voltage.

3. A differential amplifier, comprising:
the bias voltage generating circuit according to claim 2,
a differential amplifier circuit having a fifth transistor of said second conductivity type including a first and second current electrodes and a control electrode as a current circuit, and
other differential amplifier circuit having a sixth transistor of said first conductivity type including a first and second current electrodes and a control electrode as other current circuit, wherein
both a reference voltage signal and an input voltage signal are inputted to said differential amplifier circuit and said other differential amplifier circuit, respectively,
said reference voltage signal is also inputted to said control electrode of said first and fourth transistors as said voltage signal, respectively,
said first bias voltage is inputted to said control electrode of said fifth transistor, and
said second bias voltage is inputted to said control electrode of said sixth transistor.

4. A differential amplifier, comprising:
a bias voltage generating circuit, including:
a first current generating part generating a current; a first transistor of a first conductivity type including a first current electrode to which a first potential is supplied through said first current generating part, a second current electrode and a control electrode;
a second transistor of a second conductivity type different from said first conductivity type including a first current electrode to which a second potential different from said first potential is supplied, a second current electrode connected with said second current electrode of said first transistor and a control electrode connected with said second current electrode of said first transistor, wherein
said current flows between said first and second current electrodes of said first transistor and between said first and second current electrodes of said second transistor,
a voltage signal is inputted to said control electrode of said first transistor,
a potential at said second current electrode of said second transistor functions as a first bias voltage,
said bias voltage generating circuit further comprising:
a second current generating part generating other current of a similar value to that of said current generated in said first current generating part;
a third transistor of said second conductivity type including a first current electrode to which said second potential is supplied through said second current generating part, a second current electrode and a control electrode, and
a fourth transistor of said first conductivity type including a first current electrode to which said first potential is supplied, a second current electrode connected with said second current electrode of said third transistor and a control electrode connected with said second current electrode of said third transistor, wherein
said other current flows between said first and second current electrodes of said third transistor and between said first and second current electrodes of said fourth transistor,
said voltage signal is inputted to said control electrode of said third transistor, and
a potential at said second current electrode of said fourth transistor functions as a second bias voltage; and wherein,
said differential amplifier further comprises:
a differential amplifier circuit having a fifth transistor of said second conductivity type including a first and second current electrodes and a control electrode as a current circuit, and
other differential amplifier circuit having a sixth transistor of said first conductivity type including a first and second current electrodes and a control electrode as other current circuit, wherein
both a reference voltage signal and an input voltage signal are inputted to said differential amplifier circuit and said other differential amplifier circuit, respectively,
said reference voltage signal is also inputted to said control electrode of said first and fourth transistors as said voltage signal, respectively,
said first bias voltage is inputted to said control electrode of said fifth transistor, and
said second bias voltage is inputted to said control electrode of said sixth transistor.

* * * * *